(12) United States Patent
Ludwig et al.

(10) Patent No.: US 12,456,654 B2
(45) Date of Patent: Oct. 28, 2025

(54) POWER SEMICONDUCTOR MODULES

(71) Applicant: Infineon Technologies AG, Neubiberg (DE)

(72) Inventors: Marco Ludwig, Wickede (DE); Guido Boenig, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 540 days.

(21) Appl. No.: 17/942,317

(22) Filed: Sep. 12, 2022

(65) Prior Publication Data

US 2023/0077384 A1    Mar. 16, 2023

(30) Foreign Application Priority Data

Sep. 13, 2021  (EP) ..................................... 21196284

(51) Int. Cl.
*H01L 23/16*     (2006.01)
*H01L 25/065*    (2023.01)
(Continued)

(52) U.S. Cl.
CPC .......... *H01L 23/16* (2013.01); *H01L 25/0655* (2013.01); *H01L 25/18* (2013.01);
(Continued)

(58) Field of Classification Search
CPC . H01L 23/16; H01L 23/053; H01L 23/49811; H01L 25/0655; H01L 25/18;
(Continued)

(56) References Cited

U.S. PATENT DOCUMENTS 5,966,291 A * 10/1999 Baumel .............. H05K 7/20927
165/80.4
7,780,483 B1 * 8/2010 Ravlich ................ H01R 12/585
439/82
(Continued)

FOREIGN PATENT DOCUMENTS

DE   202018100486 U1   2/2018
EP       1475832 A1    11/2004
EP       3460837 A1     3/2019

OTHER PUBLICATIONS

Machine English Translation of DE 202018100486, Infineon Technologies, Published Feb. 22, 2018.*

*Primary Examiner* — Peniel M Gumedzoe
(74) *Attorney, Agent, or Firm* — Murphy, Bilak & Homiller, PLLC (57) ABSTRACT

A power semiconductor module arrangement includes at least one substrate comprising a dielectric insulation layer and a first metallization layer attached to the dielectric insulation layer; at least one semiconductor body arranged on the first metallization layer; a housing at least partly enclosing the substrate, the housing comprising sidewalls; and at least one press-on pin, wherein each press-on pin is arranged either on the substrate or on one of the at least one semiconductor body and extends from the substrate or the respective semiconductor body in a vertical direction that is perpendicular to a top surface of the substrate, and each press-on pin is mechanically coupled to at least one sidewall of the housing by means of a bar, each bar extending horizontally between the respective press-on pin and sidewall, and parallel to the top surface of the substrate.

14 Claims, 4 Drawing Sheets

(51) Int. Cl.
*H01L 25/18* (2023.01)
*H01L 23/00* (2006.01)
*H01L 23/053* (2006.01)
*H01L 23/498* (2006.01)

(52) U.S. Cl.
CPC ....... *H01L 23/053* (2013.01); *H01L 23/49811* (2013.01); *H01L 24/32* (2013.01); *H01L 24/48* (2013.01); *H01L 24/73* (2013.01); *H01L 2224/32225* (2013.01); *H01L 2224/48225* (2013.01); *H01L 2224/73215* (2013.01)

(58) Field of Classification Search
CPC ......... H01L 24/32; H01L 24/48; H01L 24/73; H01L 2224/32225; H01L 2224/48225; H01L 2224/73215
See application file for complete search history.

(56) References Cited

U.S. PATENT DOCUMENTS

2009/0213553 A1* 8/2009 Tschirbs .............. H01L 23/3735
361/728
2014/0035118 A1* 2/2014 Bayerer ................ H01L 25/072
438/122

* cited by examiner

POWER SEMICONDUCTOR MODULES

TECHNICAL FIELD

The instant disclosure relates to power semiconductor modules.

BACKGROUND

Power semiconductor modules often include a substrate arranged in a housing. A semiconductor arrangement including a plurality of controllable semiconductor elements (e.g., two IGBTs in a half-bridge configuration) may be arranged on the substrate. The substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may be attached to a heat sink or to a ground surface of the housing. The controllable semiconductor devices are usually mounted onto the substrate by soldering or sintering techniques.

A cover of the housing is often used to exert a force on the substrate such that the substrate, which often exhibits a certain arch, is pressed onto the heat sink or onto the ground surface of the housing. In this way, a good thermal transition between the substrate and the heat sink or ground surface may be achieved. However, assembling such semiconductor module arrangements is often cumbersome and there is the risk of the housing stability becoming degraded during the assembly process, which may decrease the overall lifetime of the semiconductor module arrangement.

There is a need for a semiconductor module arrangement that provides a good thermal resistance between the substrate and the heat sink or ground surface of the housing, that is easy to assemble, and that has an increased lifespan.

SUMMARY

A power semiconductor module arrangement includes at least one substrate including a dielectric insulation layer and a first metallization layer attached to the dielectric insulation layer, at least one semiconductor body arranged on the first metallization layer, a housing at least partly enclosing the substrate, the housing including sidewalls, and at least one press-on pin, wherein each press-on pin is arranged either on the substrate or on one of the at least one semiconductor bodies and extends from the substrate or the respective semiconductor body in a vertical direction that is perpendicular to a top surface of the substrate, and wherein each press-on pin is mechanically coupled to at least one sidewall of the housing by means of a bar, each bar extending horizontally between the respective press-on pin and sidewall, in parallel to the top surface of the substrate.

Another power semiconductor module arrangement includes at least one substrate including a dielectric insulation layer and a first metallization layer attached to the dielectric insulation layer, at least one semiconductor body arranged on the first metallization layer, a printed circuit board arranged distant from and parallel to the substrate, a housing at least partly enclosing the substrate and the printed circuit board, the housing including sidewalls, and at least one press-on pin, wherein each press-on pin is arranged either on the substrate or on one of the at least one semiconductor bodies and extends from the substrate or the respective semiconductor body in a vertical direction that is perpendicular to a top surface of the substrate, and wherein each press-on pin is mechanically coupled to the printed circuit board The invention may be better understood with reference to the following drawings and the description. The components in the figures are not necessarily to scale, emphasis instead being placed upon illustrating the principles of the invention. Moreover, in the figures, like reference numerals designate corresponding parts throughout the different views.

BRIEF DESCRIPTION OF THE DRAWINGS

FIG. 10, including FIGS. 10A and 10B, schematically illustrates a cross-sectional view of a press-on pin extending through a printed circuit board, and a three-dimensional view of the press-on pin according to one example.

FIG. 11, including FIGS. 11A and 11B, schematically illustrates a cross-sectional view of a press-on pin extending through a printed circuit board, and a three-dimensional view of the press-on pin according to another example.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to designate different "elements". That is, e.g., the existence of a "third element" does not require the existence of a "first element" and a "second element". An electrical line or electrical connection as described herein may be a single electrically conductive element, or may include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or may be included in a semiconductor chip. A semiconductor body has electrically connecting pads and includes at least one semiconductor element with electrodes.

Figure 1:
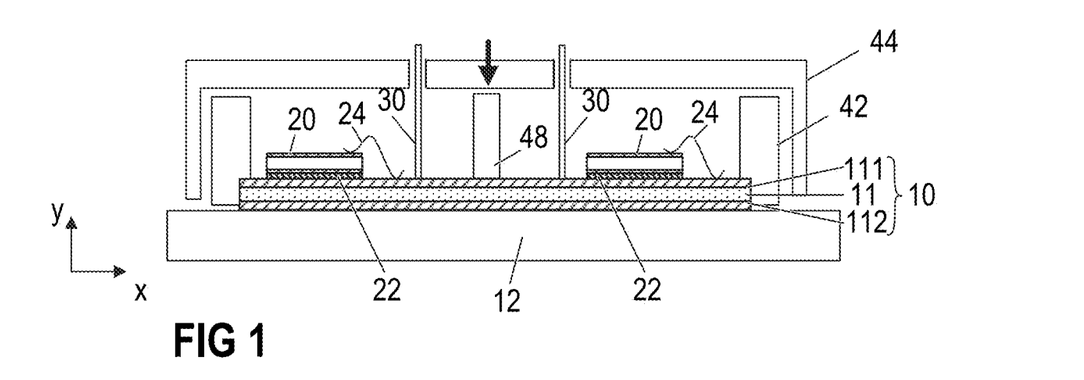
FIG. 1 is a cross-sectional view of an example of a power semiconductor module arrangement.

Referring to FIG. 1, a cross-sectional view of an exemplary power semiconductor module is illustrated. The power semiconductor module includes a housing and a substrate 10. The substrate 10 includes a dielectric insulation layer 11, a (structured) first metallization layer 111 attached to the dielectric insulation layer 11, and a second (structured) metallization layer 112 attached to the dielectric insulation layer 11. The dielectric insulation layer 11 is disposed between the first and second metallization layers 111, 112. It is, however, also possible that the substrate 10 only comprises a first metallization layer 111, and that the second metallization layer 112 is omitted.

Each of the first and second metallization layers 111, 112 may consist of or include one of the following materials: copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may be, e.g., a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $SiO_2$, $Al_2O_3$, AlN, or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing. In the example illustrated in FIG. 1, the substrate 10 is arranged on a ground surface 12 of the housing. The housing further comprises sidewalls 42 and may further comprise a cover 44. In other examples, however, the ground surface 12 of the housing may be omitted. In such cases the substrate 10 itself may form the ground surface of the housing. The substrate 10 may be arranged on a base plate or heat sink 12, for example. In the example in FIG. 1, only one substrate 10 is arranged on the ground surface, base plate or heat sink 12 (only referred to as ground surface in the following). In some power semiconductor module arrangements, more than one substrate 10 may be arranged in a single housing. The ground surface 12, the sidewalls 42 and the cover 44 may include a metal or a metal alloy, for example. It is, however, also possible that the ground surface 12, sidewalls 42 and cover 44 comprise an electrically insulating material such as a plastic or ceramic material, for example. The housing may also include a liquid crystal polymer, for example.

The substrate 10 may be connected to the ground surface 12 by means of a connection layer (not specifically illustrated in FIG. 1). Such a connection layer may be a solder layer, a layer of an adhesive material, or a layer of a sintered metal powder, e.g., a sintered silver powder, for example. Any other kind of electrically conducting or non-conducting connection layer is also possible.

One or more semiconductor bodies 20 may be arranged on the substrate 10. Each of the semiconductor bodies 20 arranged on the substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. The first metallization layer 111 of the example in FIG. 1 is also a continuous layer. However, the first metallization layer 111, the second metallization layer 112 or both can also be structured layers. "Structured layer" means that, e.g., the respective metallization layer 111, 112 is not a continuous layer, but includes recesses between different sections of the layer. Different semiconductor bodies 20 may be mounted on the same or different sections of the first metallization layer 111. Different sections of the first metallization layer 111 may have no electrical connection or may be electrically connected to one or more other sections using, e.g., bonding wires. Electrical connections may also include bonding ribbons, connection plates or conductor rails, for example, to name just a few examples. According to another example, the second metallization layer 112 can be omitted altogether. The one or more semiconductor bodies 20 may be electrically and mechanically connected to the substrate 10 by an electrically conductive connection layer 22. Such an electrically conductive connection layer 22 may be a solder layer, a layer of an electrically conductive adhesive, or a layer of a sintered metal powder, e.g., a sintered silver powder, for example.

The power semiconductor module further includes terminal elements 30. The terminal elements 30 are electrically connected to the substrate 10, e.g., to the first metallization layer 111 of the substrate 10, and form a contact element which provides an electrical connection between the inside and the outside of the housing. A first end of the terminal elements 30 may be electrically and mechanically connected to the first metallization layer 111 by an electrically conductive connection layer (not specifically illustrated). Such an electrically conductive connection layer may be a solder layer, a layer of an electrically conductive adhesive, or a layer of a sintered metal powder, e.g., a sintered silver powder, for example. A second end of the terminal elements 30 protrudes out of the housing to allow the terminal element 30 to be electrically contacted from the outside. The cover 44 may comprise openings through which the terminal elements 30 may protrude such that their first side is inside the housing and their second side is outside the housing. The terminal elements 30 may protrude vertically (i.e., perpendicular to a top surface of the substrate 10) out of the housing when the housing is arranged to surround the substrate 10. According to another example, terminal elements 30 may also protrude horizontally (parallel to the top surface of the substrate 10) through a sidewall 42 of the housing.

Figure 2:
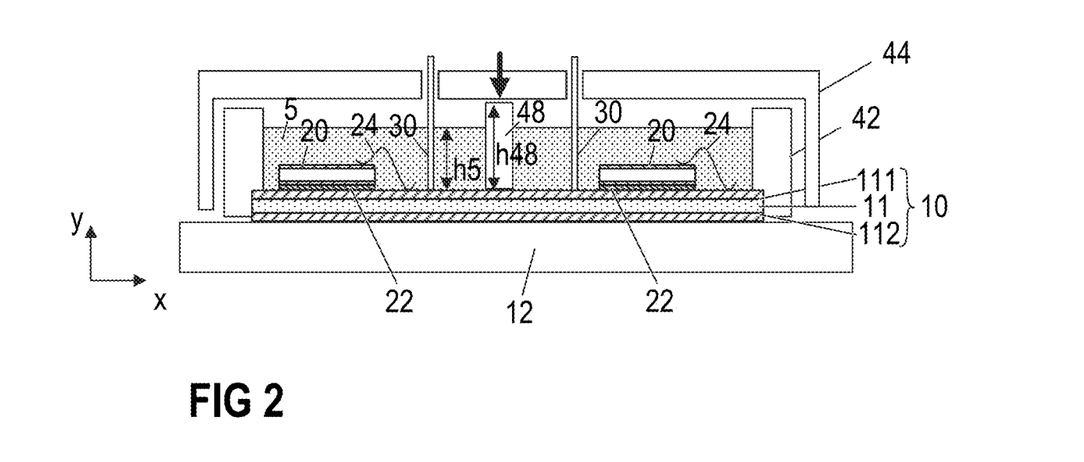
FIG. 2 is a cross-sectional view of a further example of a power semiconductor module arrangement.

A power semiconductor module may further include a casting compound 5, as is illustrated in the example of FIG. 2. The casting compound 5 may consist of or include a silicone gel or may be a rigid molding compound, for example. The casting compound 5 may partly fill the interior of the housing, thereby covering the substrate 10 and the semiconductor bodies 20, and any other components and electrical connections 24 that are arranged on the substrate 10. Electrical connections 24 such as, e.g., bonding wires or bonding ribbons, may electrically couple the semiconductor bodies 20 to the first metallization layer 111, to other semiconductor bodies 20, or to any other components that may be arranged inside the housing. The terminal elements 30 may be partly embedded in the casting compound 5. At least the second ends of the terminal elements 30, however, may not be covered by the casting compound 5 and may protrude from the casting compound 5. The casting compound 5 is configured to protect the components and electrical connections inside the power semiconductor module arrangement, in particular inside the housing, from certain environmental conditions, mechanical damage and insulation faults.

The sidewalls 42 of the housing generally may be mechanically connected to the substrate 10 by means of a joint (not specifically illustrated in the figures). This joint may be a solder joint, a cold welding joint, or an adhesive joint, for example. Any other suitable joints are also possible for mechanically connecting the sidewalls 42 of the housing to the substrate 10, which also provide a suitable seal such that no, or at least less gas can enter the housing 40. The sidewalls 42 and the ground surface 12 may also be provided as a single piece (not specifically illustrated). This means that there are no joints between the sidewalls 42 and the ground surface 12 of the housing.

The semiconductor module arrangement further comprises at least one press-on pin 48. The press-on pin 48 is arranged on the substrate 10, for example. In the Figures, the press-on pin 48 is illustrated as being arranged at a certain distance from the different semiconductor bodies 20 in a horizontal direction x. This, however, is only an example. In other examples, the press-on pin 48 may be arranged in close vicinity to at least one of the semiconductor bodies 20. In close vicinity in this context refers to a distance that is shorter than, e.g., 5 mm, 3 mm or 2 mm. According to another example, the press-on pin 48 is arranged on a semiconductor body 20 instead of on the substrate 10. If the press-on pin 48 is arranged on a semiconductor body 20, the respective semiconductor body 20 is arranged between the press-on pin 48 and the substrate 10. The press-on pin 48 may be arranged at a central position within the sidewalls 42. That is, the press-on pin 48 may be arranged at a first distance from a first sidewall and at a second distance from a second sidewall opposite the first sidewall, wherein the first distance equals the second distance, and at a third distance from a third sidewall and at a fourth distance from a fourth sidewall opposite the third sidewall, wherein the third distance equals the fourth distance.

Figure 3:
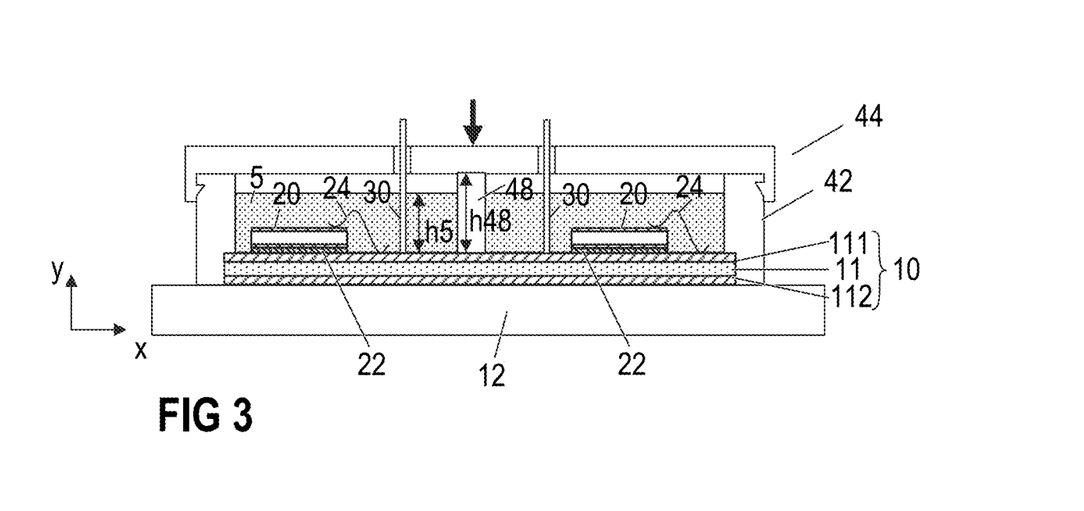
FIG. 3 is a cross-sectional view of a further example of a power semiconductor module arrangement.

When the semiconductor module arrangement is fully assembled, the substrate 10 is pressed onto the ground surface 12 of the housing in order to reduce a thermal resistance between the substrate 10 and the ground surface 12. Further, the substrate 10 is thereby kept in a desired position and is prevented from shifting inside the housing. When the cover 44 is arranged on the sidewalls 42 to close the housing, the cover 44 contacts the press-on pin 48 and exerts a pressure on the press-on pin 48. While the semiconductor module arrangement illustrated in FIGS. 1 and 2 illustrates the cover 44 still partly open, FIG. 3 illustrates an example of a semiconductor module arrangement in a final mounting position (cover 44 fully closed). The bold arrows in the figures illustrate a direction in which the cover 44 is moved while closing the housing and a direction of the pressure exerted on the press-on pin 48 once the housing is fully closed.

The semiconductor module arrangement illustrated in FIG. 1 does not comprise a casting compound 5. A casting compound 5, however, is illustrated in the examples of FIGS. 2 to 6. When the semiconductor module arrangement comprises a casting compound 5, the press-on pin 48 is largely molded in the casting compound 5. However, a second end of the press-on pin 48 facing away from the substrate 10 or the semiconductor body 20 on which the press-on pin 48 is mounted protrudes from the casting compound 5. That is, a height h48 of the press-on pin 48 in a vertical direction y that is perpendicular to a top surface of the substrate 10 is greater than a height h5 of the casting compound 5 in the same direction. Therefore, a top surface of the press-on pin 48 facing away from the substrate 10 or the semiconductor body 20 on which the press-on pin 48 is mounted is not covered by the casting compound 5. In this way, the top surface may be easily contacted by the cover 44 even if the casting compound 5 has already been formed. The cover 44 then contacts the top surface of the press-on pin 48 (but not the casting compound 5) and exerts pressure on the top surface, thereby pressing the press-on pin 48 onto the substrate 10 (or on the semiconductor body 20) and subsequently pressing the substrate 10 onto the ground surface 12. This allows the casting compound 5 to be formed even before the housing is fully closed, that is before arranging the cover 44 onto the sidewalls 42. When the casting compound 5 is formed, usually a liquid or viscous material is poured into the housing, thereby forming a liquid or viscous pre-layer. A heating step may follow during which liquid that is present in the pre-layer is at least partly evaporated. In this way, the pre-layer is hardened to form the resulting casting compound 5. Such a heating step may either be performed before arranging the cover 44 onto the sidewalls 42 or, alternatively, the heating step may be performed after mounting the cover 44 onto the sidewalls 42. When performing the heating step before mounting the cover 44 onto the sidewalls 42, the cover 44 needs not be exposed to the heat applied during the heating step. This may increase the overall lifetime of the cover 44, and thus of the complete semiconductor module arrangement because the material of the cover 44 does not become fragile or brittle when exposed to heat.

Even further, if the cover 44 is not yet mounted on the sidewalls 42, it is much easier to fill the liquid or viscous material into the housing. Undesired cavities in the casting compound 5 can be reduced or even avoided, as the material can be freely and evenly distributed over the entire surface of the substrate 10 while the cover is still open.

The casting compound 5, however, may be formed when the sidewalls 42 are already arranged to surround the substrate 10. As has been described above, the casting compound 5 is generally formed by forming a liquid or gel-like pre-layer that is subsequently hardened. The sidewalls 42 prevent the material of the pre-layer from unintentionally spreading before the hardening step.

The press-on pin 48 may comprise a solid body, for example. That is, the press-on pin 48 may comprise a main body that is entirely formed of a solid block of suitable material. According to an example, the press-on pin 48 may comprise a pin or cuboid having an angular or rounded cross-section. The casting compound 5 may then surround the press-on pin 48. As the press-on pin 48 does not have any cavities or holes, the casting compound 5 cannot extend into the press-on pin 48. According to another example, however, the press-on pin 48 may comprise at least one cavity or hole such that the casting compound 5 may at least partly fill the cavity or hole (not specifically illustrated).

In the examples illustrated in FIGS. 1 and 2, the sidewalls 42 of the housing are coupled to the substrate 10 and the substrate 10 is arranged on the ground surface 12 of the housing. The cover 44 in these examples comprises a top part, covering the opening formed by the sidewalls 42, and side parts which extend perpendicular to the top part and parallel to the sidewalls 42 of the housing when the cover 44 is arranged on the substrate 10. The side parts of the cover 44 extend from the top part towards the ground surface 12. When the semiconductor module arrangement is fully assembled, the side parts may even contact the ground surface 12. For example, the side parts may be permanently coupled to the ground surface 12 in order to fix the cover 44 in place and prevent it from moving or falling off. For example, the cover 44 may be soldered or glued to the ground surface 12.

This, however, is only an example. As is exemplarily illustrated in FIG. 3, it is also possible that the cover 44 is permanently attached to the sidewalls 42 of the housing only. The cover 44 may be glued to the sidewalls 42 or may be attached to the sidewalls by means of any suitable mechanic fixing mechanism. In the example illustrated in FIG. 3, the cover 44 comprises projections which engage with corresponding counterparts provided in the sidewalls 42. The sidewalls 42 in this example are mounted on the ground surface 12 and may have a protrusion that contacts the edges of the substrate 10, thereby pressing the edges of the substrate 10 towards the ground surface 12.

Figure 5:
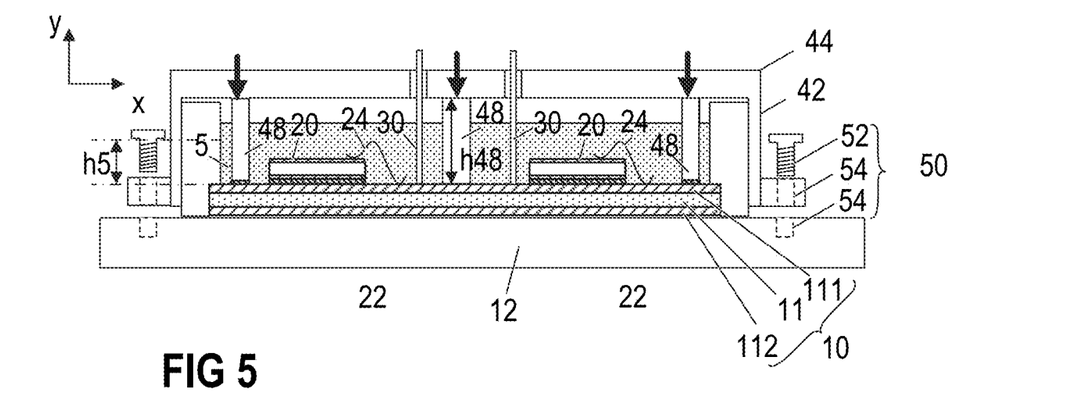
FIG. 5 is a cross-sectional view of a further example of a power semiconductor module arrangement.

The example illustrated in FIG. 5 is somewhat similar to the examples illustrated in FIGS. 1 and 2. However, in the example of FIG. 5 the side parts of the cover 44 comprise projections with threaded holes 54. The ground surface 12 may also comprise threaded holes 54. The cover 44 in this example may be attached to the ground surface 12 by means of screws or bolts 52 that are inserted into the threaded holes 54. However, any other way of permanently mounting the cover 44 on the sidewalls 42 is also possible.

Figure 4:
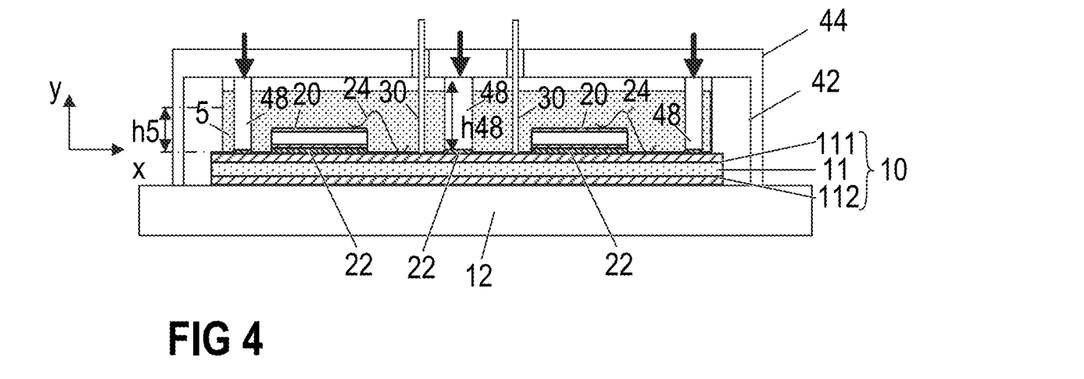
FIG. 4 is a cross-sectional view of a further example of a power semiconductor module arrangement.

In the examples illustrated in FIGS. 1, 2 and 3, the semiconductor module arrangement only comprises one press-on pin 48. This, however, is only an example. As is illustrated in FIGS. 4 and 5, the semiconductor module arrangement may also comprise more than one press-on pin 48. In the examples illustrated in FIGS. 4 and 5, the semiconductor module arrangement comprises three press-on pins 48. However, any number n of press-on pins 48 with n>1 is generally possible. When providing more than one press-on pin 48, the pressure exerted on the substrate 10 may be distributed more evenly over the substrate 10. However, a greater number of press-on pins 48 also increases the space requirements.

The press-on pins 48 may be formed of a rigid material. However, there is the risk that the pressure exerted on the substrate 10 or the semiconductor body 20 on which the press-on pin 48 is mounted may become too high. This may damage the semiconductor body 20 and/or the substrate 10. Therefore, the press-on pin 48 may be at least partly elastic such that, when the pressure exerted on the press-on pin 48 by the cover 44 exceeds a predefined threshold, the press-on pin 48 is compressed in order to limit the pressure exerted on the substrate 10 or semiconductor body 20. That is, when the cover 44 exerts pressure on the press-on pin 48, the press-on pin 48 remains in its original form as long as the pressure is below a certain threshold. Once the pressure exceeds the threshold, the press-on pin 48 is compressed to a certain degree and changes from its original form to a compressed form.

According to one example, the press-on pin 48 comprises a material that is stable up to a certain point but which becomes compressed when the pressure exceeds a certain threshold. The threshold depends on the kind of material that is used to form the press-on pin 48. Some materials stay in the compressed form once the pressure is released, others return to their original form after the pressure is released. According to another example, a compression of the press-on pin 48 may result from a structural shape of the press-on pin 48. That is, the material of the press-on pin 48 by itself may not be compressible. However, the press-on pin 48 may be bent or distorted to a certain degree under pressure.

The at least one press-on pin 48 may comprise an electrically insulating material such as a plastic material, for example. However, according to another example it is also possible that the at least one press-on pin 48 comprises an electrically conducting material. In this way, the at least one press-on pin 48 may form a contact element which provides an electrical connection between the inside and the outside of the housing. The press-on pins 48 may be electrically coupled to the outside of the housing by any suitable means, for example, to allow the press-on pins 48 to be contacted from the outside of the housing. Alternatively or additionally, it is also possible that internal electrical connections are formed by means of the press-on pin 48. The press-on pins 48 may replace at least some of the terminal elements 30, for example. It is also possible that only some, but not all, of the press-on pins 48 are used as terminal elements, while other press-on pins 48 are electrically insulating and do not serve as terminal elements.

Figure 6:
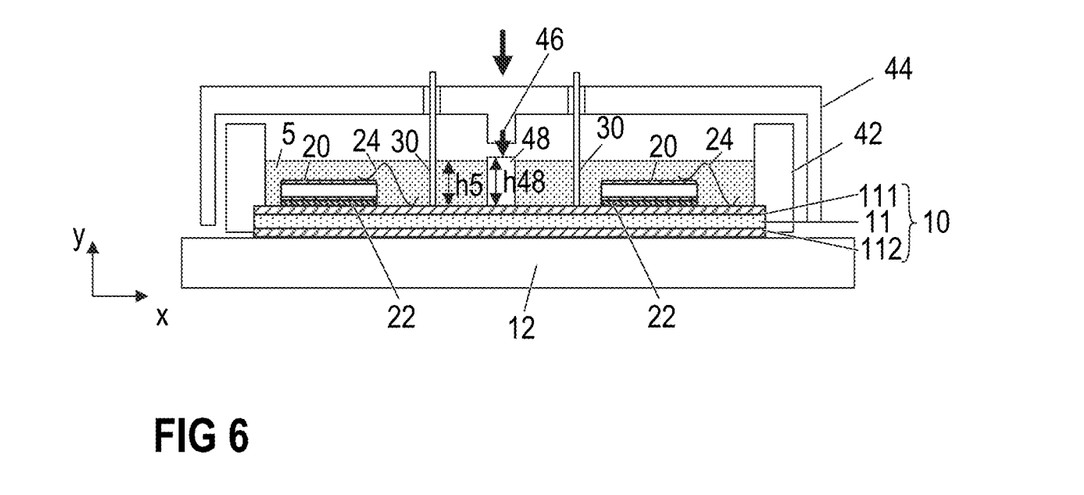
FIG. 6 is a cross-sectional view of a further example of a power semiconductor module arrangement.

Now referring to FIG. 6, a power semiconductor module arrangement according to an even further example is schematically illustrated. In this example, the cover 44 comprises a protrusion 46. The protrusion 46 may be coupled to the cover 44 or may be integrally formed with the cover 44. The protrusion 46 may be coupled to the housing in any suitable way. For example, the protrusion 46 may be coupled to the housing by means of an adhesive bond, or a screwed or bolted connection. When the cover 44 is arranged on the sidewalls 42 to close the housing, the protrusion 46 contacts the press-on pin 48 and exerts a pressure on the press-on pin 48.

Figure 7:
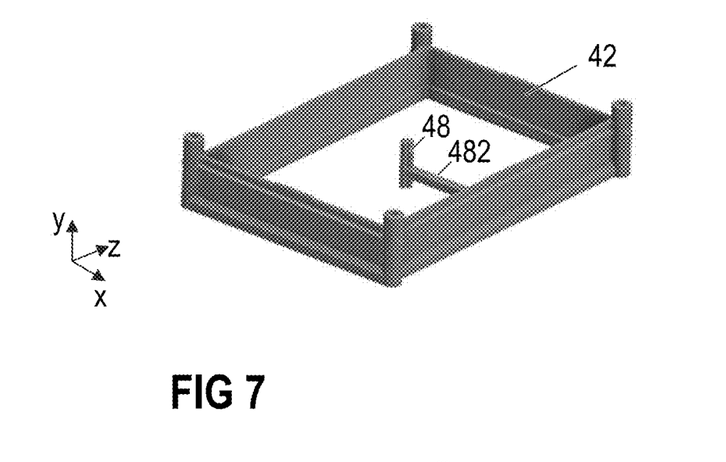
FIG. 7 illustrates a three-dimensional view of sidewalls of a housing for a power semiconductor module arrangement according to one example.
Figure 8:
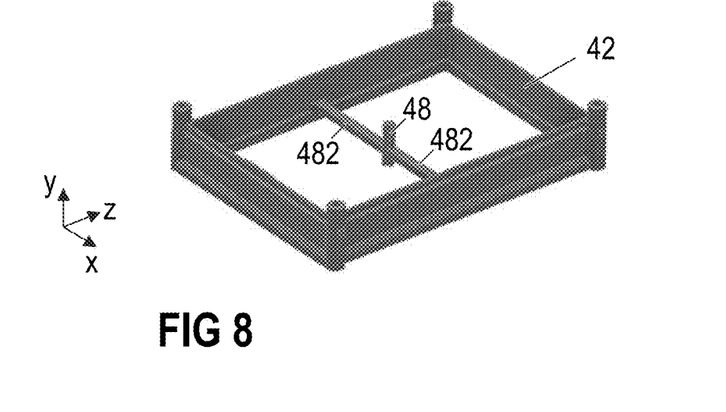
FIG. 8 is a three-dimensional view of sidewalls of a housing for a power semiconductor module arrangement according to another example.

The press-on pin 48 as illustrated in the different examples above may be held in a desired position in different ways. Referring to FIG. 7, the press-on pin 48 may be coupled to one of the sidewalls 42 of the housing by means of a bar 482. The bar 482 extends horizontally between the press-on pin 48 and the respective sidewall 42 in parallel to a top surface of the substrate 10. The top surface of the substrate 10 is a surface on which the semiconductor bodies 20 are mounted. In the example illustrated in FIG. 8, the press-on pin 48 is coupled to a first wall of the sidewalls 42 by means of a first bar 482, and to a second wall of the sidewalls 42 by means of a second bar 482, wherein the second wall is arranged opposite the first wall. The first bar 482 and the second bar 482 may have identical lengths between the press-on pin 48 and the respective sidewall 42 in order to arrange the press-on pin centrally within the housing. Due to the arrangement of semiconductor bodies 20 and any other components on the substrate 10, however, it is also possible that the bars 482 have different lengths. Depending on the overall size (cross-sectional area) of the power semiconductor module arrangement, fixing the press-on pin 48 to more than one sidewall may provide more stability to the arrangement. According to other examples (not specifically illustrated), any other number of bars 482 may be used to fix a press-on pin 48 to one or more walls of the sidewalls 42 of the housing. In the examples illustrated in FIGS. 7 and 8, the bars 482 extend perpendicular to the respective sidewalls on which they are mounted. That is, an angle of 90° is formed between each bar 482 and the respective sidewall 42. Other angles, however, are also possible. It is also possible to couple the press-on pin 48 to a first wall of the sidewalls 42 by means of a first bar 482, and to the same first wall of the sidewalls 42 by means of a second bar 482. In this case, for example, other angles than 90° may be formed between each bar 482 and the respective sidewall 42.

The bars 482 may extend distant from and vertically above the substrate 10. That is, the bars 482 may not directly contact the substrate 10, the semiconductor bodies 20 and/or any other components mounted on the substrate 10. However, the bars 482 may be arranged vertically above one or more of the semiconductor bodies 20 or any other components mounted on the substrate 10. According to another example, the at least one bar 482 may directly adjoin the substrate 10, one or more of the semiconductor bodies 20, or any other components arranged on the substrate 10. In this way, the at least one bar 482 may also exert a certain pressure on the substrate 10, on one or more of the semiconductor bodies 20, or on any other components arranged on the substrate 10, thereby pressing the substrate 10 onto the ground surface when the cover 44 is mounted on the sidewalls 42 and exerts pressure on the press-on pin 48.

The at least one bar 482 may comprise an electrically insulating material. The electrically insulating material may be or may comprise a plastic material, for example. The at least one bar 482 may comprise the same material as the press-on pin 48 and the sidewalls 42. According to another example, however, it is also possible that the bar 482, the press-on pin 48 and the sidewalls 42 comprise different materials. The at least one bar 482 and the at least one press-on pin 48 may be formed by means of injection molding, for example (e.g., 2-component injection molding).

Figure 9:
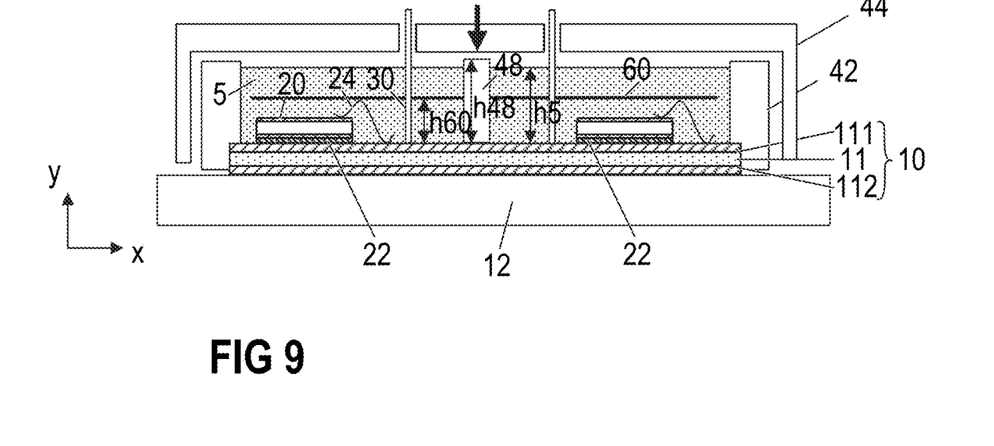
FIG. 9 is a cross-sectional view of a further example of a power semiconductor module arrangement.

Fixing the at least one press-on pin 48 by means of at least one bar 482, however, is only one example. According to another example and as is schematically illustrated in FIG. 9, the power semiconductor module arrangement may further comprise a printed circuit board 60 arranged inside the housing. After the casting compound 5 has been formed, the printed circuit board 60 may be fully enclosed by the casting compound 5. The printed circuit board 60 may comprise at least one through hole. Each of the at least one press-on pin 48 may extend through one of the through holes. The printed circuit board 60 may also comprise further through holes, wherein each of the at least one terminal element 30 extends through one of the further through holes. The at least one terminal element 30 may be at least mechanically coupled to the printed circuit board 60. For example, a solder connection may be formed between a terminal element 30 and the printed circuit board 60. In this way, the printed circuit board 60 may be held in a desired position vertically above the substrate 10. A length h48 of the at least one press-on pin 48 in the vertical direction y may be greater than a distance h60 between the substrate 10 and the printed circuit board 60. As has been described above, a height h5 of the casting compound 5 in the vertical direction y is less than the height h48 of the press-on pin 48 such that the press-on pin 48 extends out of the casting compound 5.

Figure 10A:
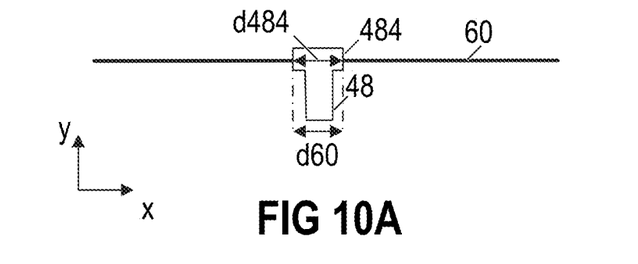
Figure 10B:
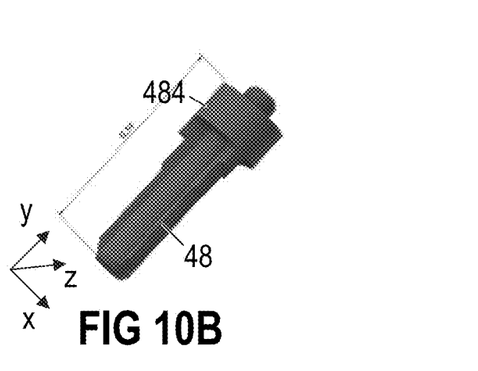

Each of the at least one press-on pin 48 may also be at least mechanically coupled to the printed circuit board 60. According to one example, and as is schematically illustrated in FIG. 10, the press-on pin 48 may comprise a circumferential protrusion 484 having a diameter d484 that equals or is slightly larger than a diameter d60 of a respective through hole of the printed circuit board 60. The circumferential protrusion 484 may be arranged in the through hole. In this way, the press-on pin 48 may be mechanically coupled to the printed circuit board 60, as the printed circuit board 60 cannot move in the vertical direction once the press-on pin 48 has been pushed through the through hole. In this case, the material of the press-on pin 48, or at least of the circumferential protrusion 484, may be somewhat flexible in order to allow the circumferential protrusion 484 to be inserted into the through hole. FIG. 10A schematically illustrates a cross-sectional view of a press-on pin 48 extending through a printed circuit board 60, while FIG. 10B schematically illustrates a three-dimensional view of an exemplary press-on pin 48. This, however, is only one example.

Figure 11A:
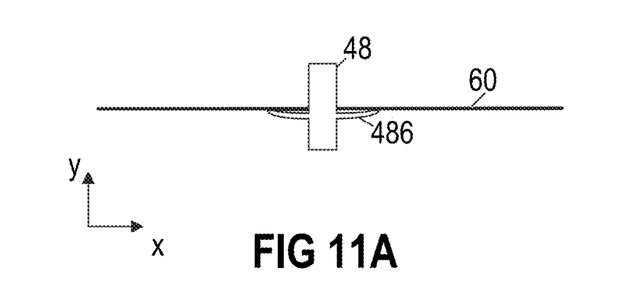
Figure 11B:
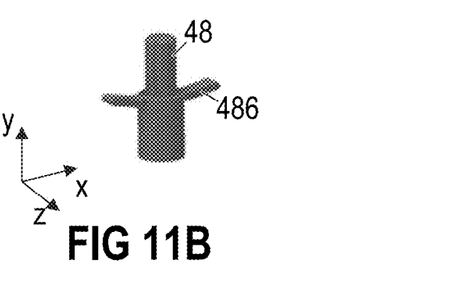

Now referring to FIG. 11, it is also possible that the press-on pin 48 comprises two or more arms 486 extending from the press-on pin 48 in a horizontal direction x. The two or more arms 486 may form an end stop for the printed circuit board 60. When the press-on pin 48 is inserted through the through hole of the printed circuit board 60, the printed circuit board 60 rests on the two or more arms 486 and prevents the press-on pin 48 from moving in the vertical direction y away from the substrate 10. That is, the press-on pin 48 is prevented from lifting off the substrate 10. The two or more arms 484 may be arranged at equal distances around the circumference of the press-on pin 48. The at least two arms 484 may be flat or may have a curved form, as is illustrated in FIG. 11. FIG. 11A schematically illustrates a cross-sectional view of a press-on pin 48 inserted through a through hole of the printed circuit board 60, and FIG. 11B schematically illustrates a three-dimensional view of an exemplary press-on pin 48. In the example of FIG. 11, it is possible to further mechanically couple the press-on pin to the substrate 10 or to one of the at least one semiconductor bodies 20. For example, the press-on pin 48 may be soldered to the substrate 10 or to the semiconductor body. It is also possible that a pin (not specifically illustrated) is arranged on the substrate 10 or the semiconductor body 20, wherein the press-on pin 48 comprises a hollow sleeve at its first end. The pin may be inserted into the hollow sleeve of the press-on pin 48, thereby at least temporarily holding the press-on pin 48 in a desired position until the printed circuit board 60 has been arranged in the housing.

The embodiments illustrated in FIGS. 10 and 11 are merely examples. A press-on pin 48 extending through a printed circuit board 60 may be implemented in any other suitable way. The arrangement may also comprise more than one press-on pin 48, similar to what has been described above. Depending on the shape of the press-on pin 48, it may either be mechanically coupled to the printed circuit board 60 in a first step, and, in a second step, the printed circuit board 60 together with the press-on pin 48 may then be inserted into the housing. Alternatively, it is however also possible that the press-on pin 48 is arranged in the housing first, wherein the printed circuit board is inserted into the housing and mechanically coupled to the press-on pin 48 in a subsequent step.

In the examples illustrated in FIGS. 10 and 11, the press-on pin 48 is not connected to the sidewalls 42 by means of bars 482. Instead, the press-on pin 48 is held in its desired position by means of the printed circuit board 60. It is, however, possible to combine the different embodiments, wherein a resulting embodiment comprises a press-on pin 48 that is coupled to at least one sidewall 42 of the housing by means of at least one bar 482, and wherein the press-on pin 48 is further mechanically coupled to a printed circuit board 60 arranged inside the housing.

Figure 12:
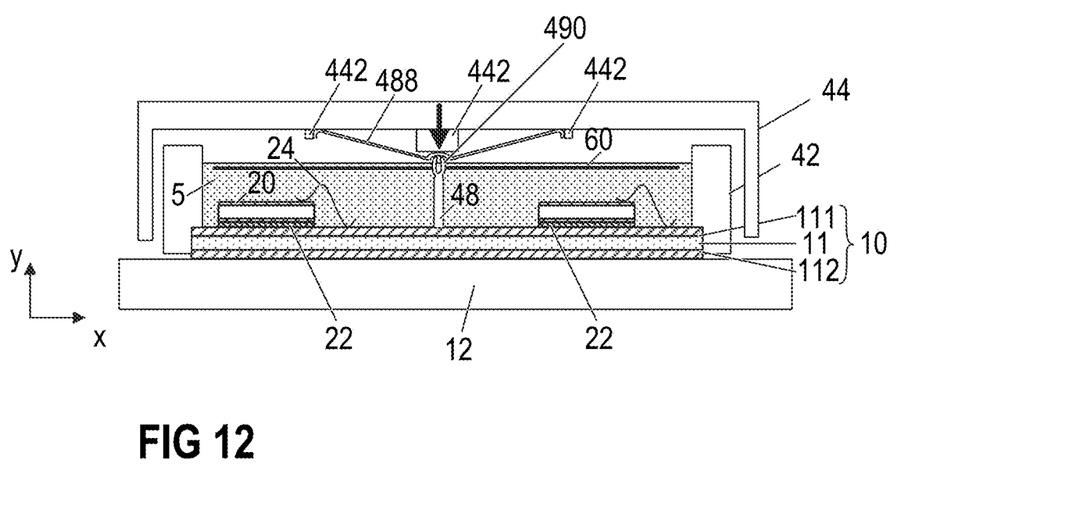
FIG. 12 is a cross-sectional view of an even further example of a power semiconductor module arrangement.

Now referring to FIG. 12, it is also possible that the press-on pin 48 comprises or is a pressfit pin 490. For example, the press-on pin 48 may comprise a pressfit pin 490 at its second end which faces away from the substrate 10. The pressfit pin 490 may be inserted in the respective through hole of the printed circuit board 60, the through hole forming a counterpart for the pressfit pin 490. When not yet connected to its counterpart, a pressfit pin 490 has a larger width than the counterpart. The width of the pressfit pin 490 is a width in a horizontal direction x, z parallel to the top surface of the substrate 10. During the press-in process, the pressfit pin 490 is pushed into the counterpart. This results in a plastic deformation of the pressfit pin 490. When inserted into the counterpart, the width of the pressfit pin 490 is reduced. Only small insertion forces are generally necessary, while at the same time, high holding forces result. The pressfit pin 490 and the counterpart are firmly attached to each other after the pressfit pin 490 is inserted. The reduced width of the pressfit pin 490 results in a force which counteracts the compression of the pressfit pin 490. When the press-on pin 48 is inserted in the through hole, the printed circuit board 60, may not be easily detached from the press-on pin 48.

The power semiconductor module arrangement may further comprise a spring element 488. The spring element 488 is arranged between the second end (the pressfit pin 490) of the press-on pin 48 and the cover 44. When the cover 44 is arranged on the sidewalls 42 to close the housing, the spring element 488 is clamped between the cover 44 and the press-on pin 48, and transmits the force exerted by the cover 44 in the vertical direction y to the pressfit pin 490. The spring element 488 may have the form of a "V", for example, as is illustrated in FIG. 12. The two loose ends of the V-shaped spring element 488 contact the cover 44, while the lower arch of the V-shaped spring element 488 contacts the pressfit pin 490. The lower arch of the V-shaped spring element 488 may have an indentation, and the pressfit pin 490 may engage with the indentation. In this way, the spring element 488 may be prevented from shifting in a vertical direction x, z with respect to the press-on pin 48. The cover 44 may comprise a plurality of protrusions 442 extending from the cover 44 in the vertical direction y towards the substrate 10. The loose ends of the spring element 488 and the lower arch of the V-shaped spring element 488 may each contact a different one of the protrusions 442. The protrusions 442 are configured to prevent the spring element 488 from shifting. The spring element 488 may comprise a metal, for example. Metals generally can endure higher temperatures than, e.g., plastic materials. High temperatures may arise during the assembly of the power semiconductor module arrangement. The spring element 488 may be permanently mounted on the cover 44, for example. That is, the spring element 488 may already be mounted on the cover 44, when the cover 44 has been mounted on the sidewalls 42 to close the housing.

The invention claimed is:

1. A power semiconductor module arrangement comprising:
   at least one substrate comprising a dielectric insulation layer and a first metallization layer attached to the dielectric insulation layer;
   at least one semiconductor body arranged on the first metallization layer;
   a cover;
   a housing at least partly enclosing the substrate, the housing comprising sidewalls; and
   at least one press-on pin, wherein
   each press-on pin is arranged either on the substrate or on one of the at least one semiconductor body and extends from the substrate or the respective semiconductor body in a vertical direction that is perpendicular to a top surface of the substrate,
   each press-on pin is mechanically coupled to at least one sidewall of the housing by means of a bar, each bar extending horizontally between the respective press-on pin and sidewall, and parallel to the top surface of the substrate,
   the cover is arranged on the sidewalls, thereby closing the housing in the vertical direction,
   the cover exerts pressure on the press-on pin in the vertical direction, thereby pressing the press-on pin onto the substrate or onto the respective semiconductor body.

2. The power semiconductor module arrangement of claim 1, further comprising a casting compound covering the substrate and partly filling the housing, wherein the casting compound has a thickness in the vertical direction, and
   the press-on pin has a height in the vertical direction that is greater than the thickness of the casting compound such that a top surface of the press-on pin that faces away from the substrate or the semiconductor body is not covered by the casting compound.

3. The power semiconductor module arrangement of claim 1, wherein at least one of the at least one bar extends vertically above the substrate such that it does not directly contact the substrate, the semiconductor bodies, or any other components arranged on the substrate.

4. The power semiconductor module arrangement of claim 1, wherein at least one of the at least one press-on pin is mechanically coupled to a first sidewall of the housing by means of a first bar, and to a second sidewall, opposite the first sidewall, by means of a second bar.

5. The power semiconductor module arrangement of claim 1, further comprising a base plate or heat sink, wherein, when the cover exerts pressure on the press-on pin in the vertical direction, the substrate is pressed onto the base plate or heat sink by means of the at least one press-on pin.

6. The power semiconductor module arrangement of claim 1, wherein the at least one press-on pin comprises an electrically insulating material.

7. The power semiconductor module arrangement of claim 1, wherein the at least one press-on pin comprises a solid body.

8. A power semiconductor module arrangement comprising:
   at least one substrate comprising a dielectric insulation layer and a first metallization layer attached to the dielectric insulation layer;
   at least one semiconductor body arranged on the first metallization layer;
   a printed circuit board arranged distant from and in parallel to the substrate;
   a housing at least partly enclosing the substrate and the printed circuit board, the housing comprising sidewalls; and
   at least one press-on pin, wherein
   each press-on pin is arranged either on the substrate or on one of the at least one semiconductor body and extends from the substrate or the respective semiconductor body in a vertical direction that is perpendicular to a top surface of the substrate,
    each press-on pin is mechanically coupled to the printed circuit board, and at least one of the at least one press-on pin is formed of electrically insulating material.

9. The power semiconductor module arrangement of claim 8, wherein the printed circuit board comprises at least one through hole, and each of the at least one press-on pin extends through a different one of the at least one through hole.

10. The power semiconductor module arrangement of claim 9, wherein at least one of the at least one press-on pin comprises a circumferential protrusion having a diameter that equals or is slightly larger than a diameter of a respective through hole of the printed circuit board, and wherein the circumferential protrusion is arranged in the respective through hole.

11. The power semiconductor module arrangement of claim 9, wherein at least one of the at least one press-on pin comprises two or more arms extending from the press-on pin in a horizontal direction, the two or more arms forming an end stop for the printed circuit board such that, when the press-on pin is inserted through the respective through hole of the printed circuit board, the printed circuit board prevents the press-on pin from moving in the vertical direction away from the substrate.

12. The power semiconductor module arrangement of claim 9, wherein at least one of the at least one press-on pin comprises a pressfit pin, the pressfit pin being inserted in the respective through hole of the printed circuit board, the through hole forming a counterpart for the pressfit pin.

13. The power semiconductor module arrangement of claim 12, further comprising
    a cover arranged on the sidewalls to close the housing in the vertical direction, and
    a spring element arranged between a second end of the press-on pin facing away from the substrate and the cover, wherein
    the spring element is clamped between the cover and the press-on pin, and transmits a force exerted by the cover in the vertical direction to the pressfit pin.

14. A power semiconductor module arrangement comprising:
    at least one substrate comprising a dielectric insulation layer and a first metallization layer attached to the dielectric insulation layer;
    at least one semiconductor body arranged on the first metallization layer;
    a cover;
    a housing at least partly enclosing the substrate, the housing comprising sidewalls; and
    at least one press-on pin, wherein
    each press-on pin is arranged either on the substrate or on one of the at least one semiconductor body and extends from the substrate or the respective semiconductor body in a vertical direction that is perpendicular to a top surface of the substrate,
    each press-on pin is mechanically coupled to at least one sidewall of the housing by means of a bar, each bar extending horizontally between the respective press-on pin and sidewall, and parallel to the top surface of the substrate,
    wherein at least one of the at least one bar directly adjoins the substrate, one or more of the semiconductor bodies, or other components arranged on the substrate.

* * * * *